(12) United States Patent
Fujii et al.

(10) Patent No.: US 8,735,181 B2
(45) Date of Patent: May 27, 2014

(54) MANUFACTURING SYSTEM FOR SEMICONDUCTOR DEVICE CAPABLE OF CONTROLLING VARIATION IN ELECTRICAL PROPERTY OF ELEMENT IN WAFER SURFACE AND METHOD FOR MANUFACTURING THE SEMICONDUCTOR DEVICE

(75) Inventors: Osamu Fujii, Yokohama (JP);
Yoshimasa Kawase, Yokohama (JP);
Hisato Oyamatsu, Yokohama (JP);
Takeshi Shibata, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 508 days.

(21) Appl. No.: 12/251,558

(22) Filed: Oct. 15, 2008

(65) Prior Publication Data
US 2009/0114853 A1     May 7, 2009

(30) Foreign Application Priority Data

Oct. 18, 2007   (JP) ................................. 2007-271513

(51) Int. Cl.
    *G01R 31/26*      (2006.01)
(52) U.S. Cl.
    USPC .......................................................... 438/14
(58) Field of Classification Search
    USPC ....................................................... 438/14–18
    See application file for complete search history.

(56) References Cited

U.S. PATENT DOCUMENTS

| | | | | |
|---|---|---|---|---|
| 4,021,675 | A | * | 5/1977 | Shifrin ...................... 250/492.2 |
| 5,981,961 | A | * | 11/1999 | Edwards et al. ......... 250/492.21 |
| 6,387,735 | B1 | | 5/2002 | Ueda |
| 6,482,660 | B2 | | 11/2002 | Conchieri |
| 7,249,343 | B2 | | 7/2007 | Okuno |
| 2003/0162341 | A1 | * | 8/2003 | Raebiger et al. .............. 438/197 |
| 2005/0015736 | A1 | | 1/2005 | Okuno |
| 2005/0176225 | A1 | | 8/2005 | Lee et al. |
| 2005/0244989 | A1 | | 11/2005 | Shibata et al. |
| 2006/0024938 | A1 | * | 2/2006 | Yue et al. ...................... 438/595 |
| 2006/0091473 | A1 | * | 5/2006 | Watanabe et al. ............. 257/369 |
| 2006/0183290 | A1 | | 8/2006 | Kamada et al. |

FOREIGN PATENT DOCUMENTS

| | | |
|---|---|---|
| JP | 2001-196580 A | 7/2001 |
| JP | 2005-051210 A | 2/2005 |
| JP | 2005-092278 A | 4/2005 |
| JP | 2005-223341 A | 8/2005 |
| JP | 2005-236233 A | 9/2005 |
| JP | 2005-310634 A | 11/2005 |
| JP | 2006-190795 A | 7/2006 |
| JP | 2007-305655 A | 11/2007 |

* cited by examiner

*Primary Examiner* — Matthew Reames
(74) *Attorney, Agent, or Firm* — Foley & Lardner LLP (57) ABSTRACT

A measuring device measures a gate length of a plurality of gate electrodes formed on a wafer. A calculation device calculates data of an ion implantation dosage for making uniform a threshold voltage in a wafer surface on the basis of distribution of the gate length in a wafer surface measured by the measuring device. The ion implantation device implants ions into the wafer on the basis of the data of the ion implantation dosage calculated by the calculation device.

5 Claims, 9 Drawing Sheets

MANUFACTURING SYSTEM FOR SEMICONDUCTOR DEVICE CAPABLE OF CONTROLLING VARIATION IN ELECTRICAL PROPERTY OF ELEMENT IN WAFER SURFACE AND METHOD FOR MANUFACTURING THE SEMICONDUCTOR DEVICE

CROSS-REFERENCE TO RELATED APPLICATIONS

This application is based upon and claims the benefit of priority from prior Japanese Patent Application No. 2007-271513, filed Oct. 18, 2007, the entire contents of which are incorporated herein by reference.

BACKGROUND OF THE INVENTION

1. Field of the Invention

The present invention relates to a semiconductor manufacturing system for example, and more particularly to, a manufacturing system for a semiconductor device controlling an ion implantation process and a method for manufacturing the semiconductor device.

2. Description of the Related Art

In the conventional manufacturing process of a semiconductor device, various efforts have been undertaken to control the variation in, for example, a gate length of a transistor and an ion implantation dosage. Additionally, effort has been put into the reduction of the variation in an electrical property of an element for each wafer and for each lot. In particular, in-plane uniformity in the electrical property has been improved in each of various treatment processes against the variation in the electrical property of the element in a wafer surface. However, the variation width at the final stage is still large, and therefore, the control of the variation width has been required. Particularly, with respect to a wafer with a diameter of 300 mm which is recently used, the improvement of the in-plane uniformity of the electrical property is more required than the wafer with a diameter of 200 mm.

For example, in the ion implantation, information of a threshold voltage of a previously manufactured transistor which is distribution information in a wafer surface is input to a calculation part. The calculation part calculates a correction factor for each chip with respect to a normal processing condition by use of a variation rate of the threshold voltage for the ion implantation dosage and the information of the threshold voltage so that the variation in the threshold voltage between each chip is reduced. It has been developed that a control part obtains the ion implantation dosage calculated by multiplying the correction factor by the normal processing condition, and, thus, to implant ions in each region in accordance with the ion implantation dosage (see, Jpn. Pat. Appln. KOKAI Publication No. 2005-310634, for example). However, this method is difficult to secure a sufficient in-plane uniformity.

Therefore, it has been expected to develop a manufacturing system for a semiconductor device, which even when a structure obtained in an inspection process in the manufacturing of the semiconductor device is removed from a management specification, can realize the control of the variation in the final electrical property in a wafer surface by the correction in the ion implantation process, whereby the yield of products can be improved, and a method for manufacturing the semiconductor device.

BRIEF SUMMARY OF THE INVENTION

According to a first aspect of the invention, there is provided a manufacturing system for a semiconductor device, comprising: a measuring device configured to measure a gate length of a plurality of gate electrodes formed on a wafer; a calculation device configured to calculate data of ion implantation dosage on the basis of distribution of gate length in a wafer surface measured by the measuring device, wherein the data is used for making uniform, in the wafer surface, a threshold voltage of a plurality of transistors respectively including the plurality of gate electrodes; and an ion implantation device configured to implant ions into the wafer on the basis of the data of the ion implantation dosage calculated by the calculation device.

According to a second aspect of the invention, there is provided a manufacturing system for a semiconductor device, comprising: a measuring device configured to measure a gate width of a plurality of gate electrodes formed on a wafer; a calculation device configured to calculate data of an ion implantation dosage on the basis of distribution of the gate width in a wafer surface measured by the measuring device, wherein the data is used for making uniform, in the wafer surface, a threshold voltage of a plurality of transistors respectively including the plurality of gate electrodes; and an ion implantation device configured to implant ions into the wafer on the basis of the data of the ion implantation dosage calculated by the calculation device.

According to a third aspect of the invention, there is provided a method for manufacturing a semiconductor device, comprising: forming a plurality of gate electrodes on a wafer; measuring one of a gate width and a gate length of a plurality of gate electrodes formed on the wafer; calculating data of an ion implantation dosage for making uniform a threshold voltage in a wafer surface on the basis of distribution of one of the measured gate width and the measured gate length in a wafer surface; and implanting ions into the wafer on the basis of the calculated data of the ion implantation dosage.

DETAILED DESCRIPTION OF THE INVENTION

Hereinafter, embodiments of the invention are described with reference to the drawings.

(First Embodiment)

Figure 2:
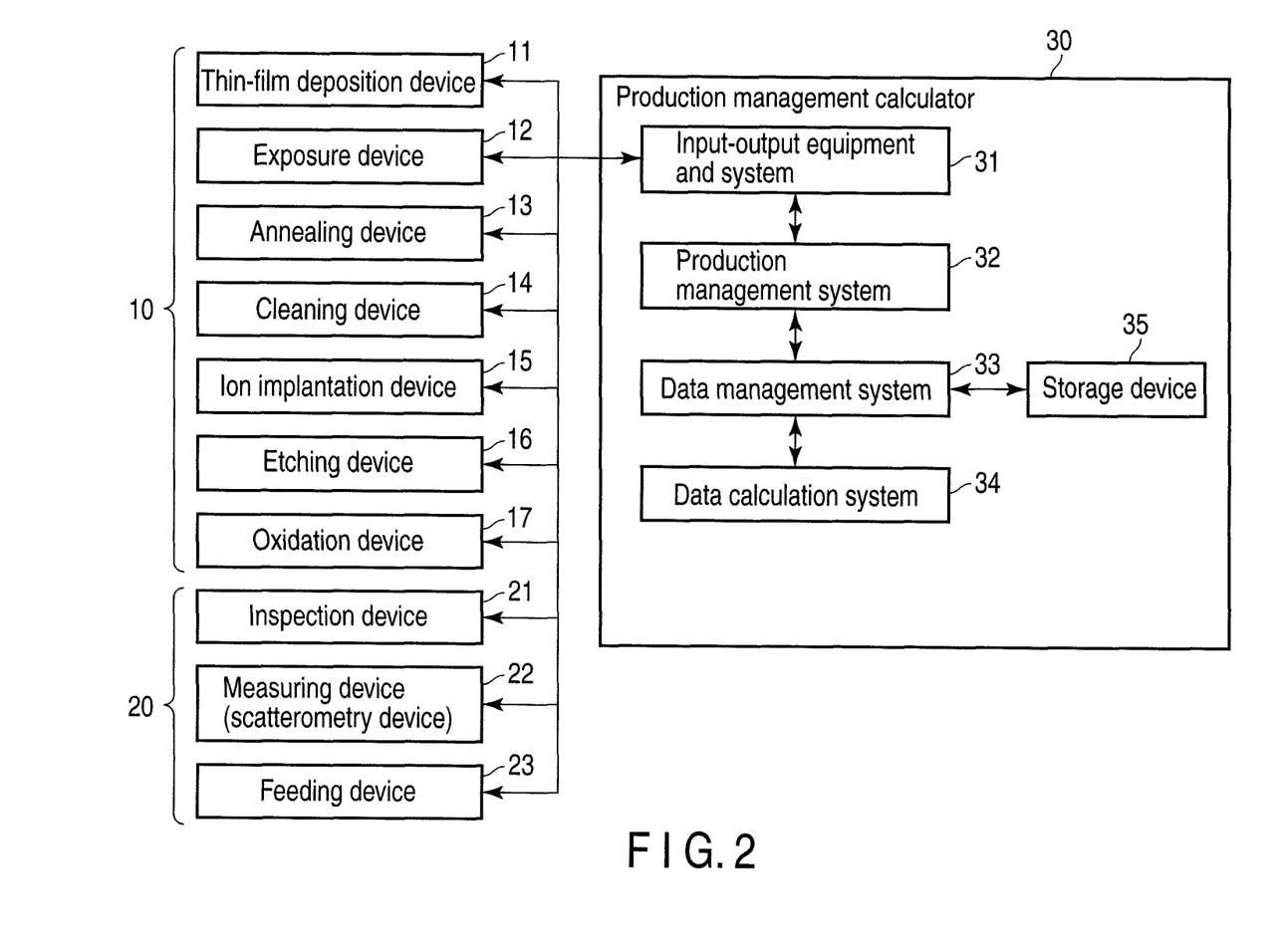
FIG. 2 is a schematic diagram showing a manufacturing system for a semiconductor device to which the present embodiment is applied.

FIG. 2 shows a manufacturing system for a semiconductor device to which the present embodiment is applied. This manufacturing system is constituted of a first device group 10, a second device group 20, and a production management calculator 30. The first device group 10 is used in a production line, for example, and relates to the processing and manufacturing of a semiconductor device. The second device group 20 relates to inspection, measurement, feeding, and so on. The production management calculator 30 can perform bidirectional communication of a production name, a lot, a wafer, recipe information, measurement data, and so on with the first and second device groups 10 and 20.

The first device group 10 relating to the processing and manufacturing of a semiconductor device is constituted of a thin-film deposition device 11 constituted of, for example, a CVD device for depositing a thin film on, for example, a wafer, an exposure device 12 for exposing a resist, an annealing device 13 for applying heat treatment to a formed film, a cleaning device 14 for cleaning a wafer surface, an ion implantation device 15 for implanting ions into a wafer, an etching device 16 for etching a film, and an oxidation device 17 for oxidizing a film. The second device group 20 relating to inspection, measurement, feeding, and so on is constituted of an inspection device 21 including, for example, a dimension SEM (scanning electron microscope), a measuring device 22 including a scatterometry device, and a feeding device 23.

The production management calculator 30 is constituted of, for example, an input-output equipment and system 31, a production management system 32, a data management system 33, a data calculation system 34, and a storage device 35. The input-output equipment and system 31 has a function of exchanging information with the first and second device groups 10 and 20. The input-output equipment and system 31 can automatically change communication protocol and data format. The production management system 32 directs the entire production of the semiconductor device and manages a management specification and various data of a product. Namely, the production management system 32 has a function of constantly monitoring and controlling the process and device in which all products, rots, and wafers exist and the kind of recipe used for processing the products, rots, and wafers. The data management system 33 has a function of storing sent and received data in the storage device 35 such as a hard disk device and managing the data. Index information is automatically allocated to the data stored in the storage device 35, whereby the data can be easily referred. The data calculation system 34 can realize the reference of past and present data stored in a recording device through the data management system 33. Further, the data calculation system 34, as described below, calculates data of a dose amount of impurity ions implanted into a source/drain area on the basis of data of a gate length and data of a gate width for example. This calculation result is sent to the production management system 32 through the data management system 33. The production management system 32 automatically performs processing such as change of the recipe information on the basis of the data sent from the data calculation system 34.

A scatterometry device which is one of the measuring device 22 applies light to a periodical pattern formed in the semiconductor device to measure the change of the polarization state due to the reflection from the pattern, and, thus, to compare the measured waveform with a theoretical waveform obtained from an optical model, whereby the shape information such as the width, height, and angle of the pattern can be identified.

The scatterometry device realizes a nondestructive and contactless measurement of the width of the uppermost part of a gate electrode, the width of the bottom part, the width of the center part, a curvature radius of a gate electrode lower part (a skirt part), the angle of a gate electrode lower part sidewall (a skirt part), a digging amount of a silicon substrate generated in the gate processing, the height from the central part to the lower part in the height direction of the gate electrode (the height of the skirt part), and the height from the central part to the upper part in the height direction of the gate electrode, the thickness of an offset film formed on the sidewall of an electrode, the digging amount of a silicon substrate generated in the processing of the offset film, the thickness of a sidewall insulating film, the digging amount of the silicon substrate generated in the processing of the sidewall insulating film, and so on. Thus, the scatterometry device can realize the measurement of the information, which has been obtained by destruction, such as the width of a bottom part of a gate electrode, a digging amount of a minute silicon substrate, the constriction level of a gate electrode, and the thickness of an offset film. There is a short time required for the measurement, for example about several seconds. Therefore, even if the measurement is performed with respect to plural regions in a wafer surface, a large time loss does not occur. Further, the dimensional measurement accuracy is about ±1 nm and is more sufficient than a 65 nm generation transistor with a gate length of 40 nm.

Figure 1:
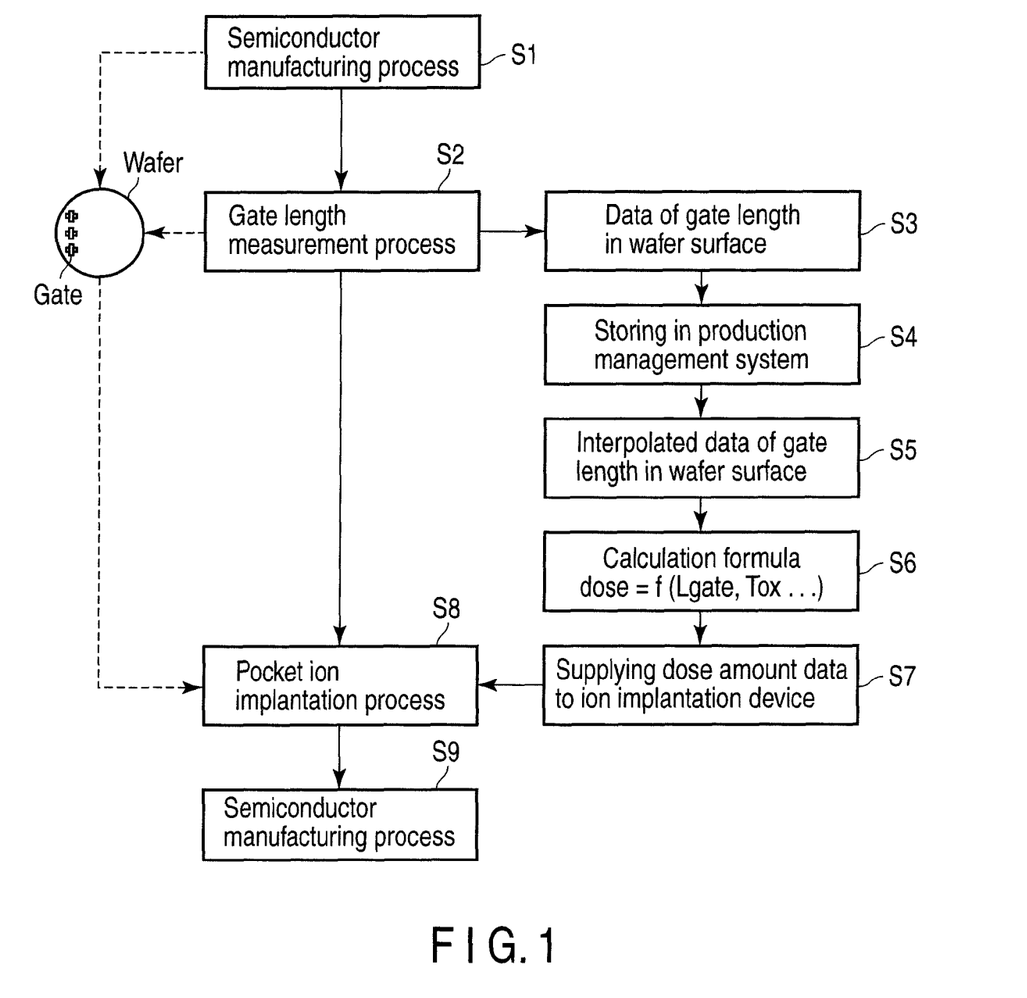
FIG. 1 is a flowchart showing the operation of a first embodiment.

FIG. 1 shows the embodiment of the invention and shows the operation of the manufacturing system for the semiconductor device shown in FIG. 2.

For example, a gate electrode of a transistor as a semiconductor device is manufactured on a wafer by means of the first device group 10 shown in FIG. 2 (S1). Next, the gate length substantially affecting the threshold voltage of the transistor is measured by the inspection device 21 and the measuring device 22 constituting the second device group 20 (S2 and S3). Namely, the gate length is measured by means of a dimension SEM, a scatterometry device, and the like. The measurement data is stored in the production management system 32 through the input-output equipment and system 31 of the production management calculator 30 (S4).

In the measurement of the gate length, although all chips in a wafer may be measured, only the gate lengths at some representative positions may be measured. It has been known that the gate length of a transistor in a wafer is different depending on the position in the wafer surface. Namely, the gate length has a positional dependence in the wafer surface. Therefore, when only the gate lengths at some positions are measured, the data of unmeasured positions is required to be predicted by the fitting function representing the positional dependence in the wafer surface. Specifically, for example, the data of measured gate length is calculated using the fitting function by means of the data calculation system 34, and the data of the gate lengths at unmeasured positions is interpolated (S5). Thus, measured or predicted data of the gate length in a wafer surface can be obtained.

Thereafter, on the basis of the measured or predicted data of the gate length in the wafer surface, the data of the dose amount in a wafer surface is created based on a calculation formula in order to provide the dose amount, regulated to obtain an intended threshold voltage, in the pocket ion implantation (S6). Namely, for example, the dose amount can be obtained as a function of a gate length Lgate, as shown in the following formula:

$$dose=f(Lgate)$$

On the basis of the above formula, the data calculation system 34, for example, calculates the dose amount on the basis of the data of a gate length and the data of gate oxide film thickness stored in the production management system 32. This calculation is performed for each gate formed in the wafer surface. Thus, this calculation result becomes the data of distribution of the dose amount in a wafer surface. This data is stored in the production management system 32, for example.

Figure 3:
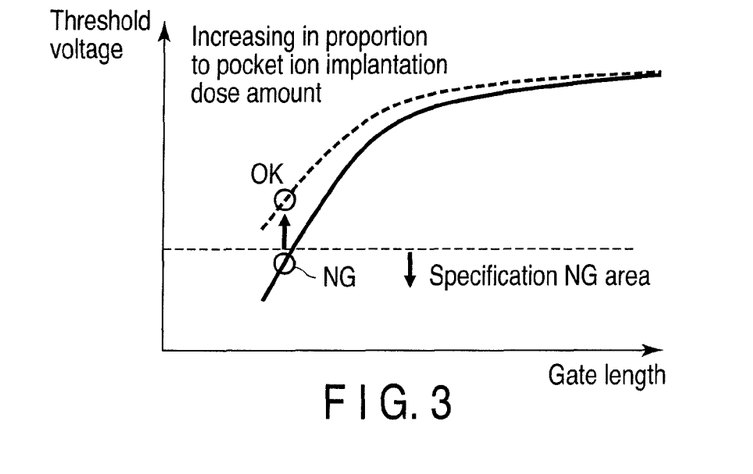
FIG. 3 is a view showing a relation between a gate length and a threshold voltage.

FIG. 3 shows a relation between the gate length and the threshold voltage. As shown by solid lines in FIG. 3, when the gate length of the transistor is reduced by some causes, the threshold voltage may be lower than the specification. In order to relieve a chip including the transistor with a small gate length, the dose amount in the pocket ion implantation is increased, whereby, as shown by dashed lines in FIG. 3, the threshold voltage is required to be increased within the specification. The data of the dose amount is calculated by the above formula in accordance with the measured gate length. The data of the dose amount is calculated based on the gate length; however, it is not limited to this, and the data of the dose amount can be calculated using plural parameters such as the gate length Lgate and gate oxide film thickness Tox, as shown by the following formula, for example:

$$dose=f(Lgate, Tox, \ldots)$$

Next, the obtained data of the dose amount, that is, the data of the pocket ion implantation amount in the wafer surface is supplied to the ion implantation device 15 of the first device group 10 (S7). The ion implantation device 15 controls the ion implantation into the wafer in accordance with the supplied dose amount data (S8). The ion implantation device 15 scans the wafer with an ion beam one by one, and, thus, to implant ions into the wafer. Namely, the ion implantation device 15 controls the scanning speed of the beam, that is, the dose amount in accordance with the distribution data in the wafer surface of the dose amount to perform the pocket ion implantation corresponding to each gate.

Figure 4:
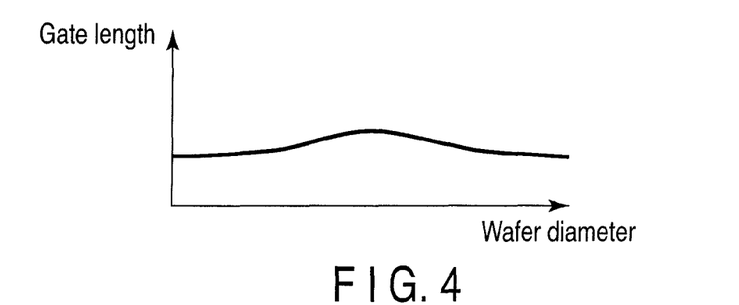
FIG. 4 is a view showing an example of distribution of the gate length in a wafer surface.

FIG. 4 is a view showing distribution of the gate length and shows an example in which the gate length at the wafer outer periphery is finished to be smaller than the gate length at the wafer central part.

Figure 5:
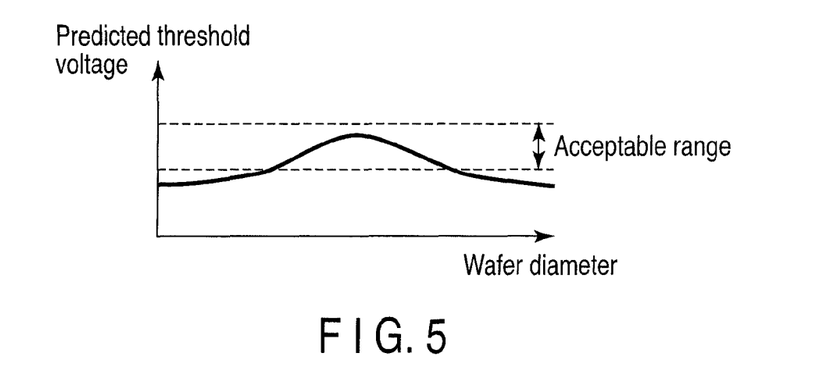
FIG. 5 is a view showing distribution of an expected threshold voltage corresponding to the distribution of the gate length shown in FIG. 4.

FIG. 5 shows distribution of a predicted threshold voltage corresponding to the distribution of the gate length shown in FIG. 4. In the distribution of the gate length shown in FIG. 4, the predicted threshold voltage is not more than an acceptable range only at the wafer outer periphery, as shown in FIG. 5.

Figure 6:
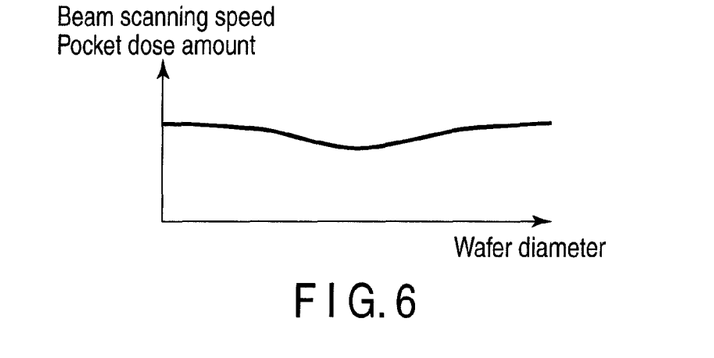
FIG. 6 is a view showing distribution of a dose amount for correcting the distribution of the threshold voltage shown in FIG. 4.
Figure 7:
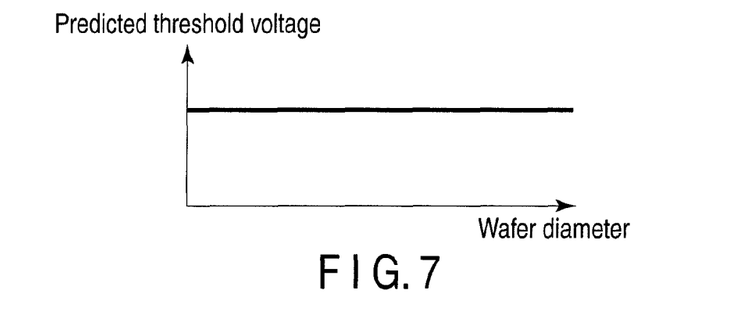
FIG. 7 is a view showing the threshold voltage distribution after correction.

FIG. 6 shows distribution of a dose amount for correcting the distribution of the threshold voltage shown in FIG. 5. In order to correct the distribution of the threshold voltage shown in FIG. 5, as shown in FIG. 6, the dose amount in the pocket ion implantation at the wafer outer peripheral part is required to be rendered larger than the wafer central part, and the threshold voltage at the wafer outer peripheral part is required to be increased. Namely, the beam scanning speed at the wafer outer peripheral part upon the pocket ion implantation is rendered slower than the beam scanning speed at the wafer central part, and the pocket dose amount at the wafer outer peripheral part is rendered larger than the pocket dose amount at the wafer central part, whereby, as shown in FIG. 7, an even threshold voltage distribution in a wafer surface can be obtained.

Figure 8:
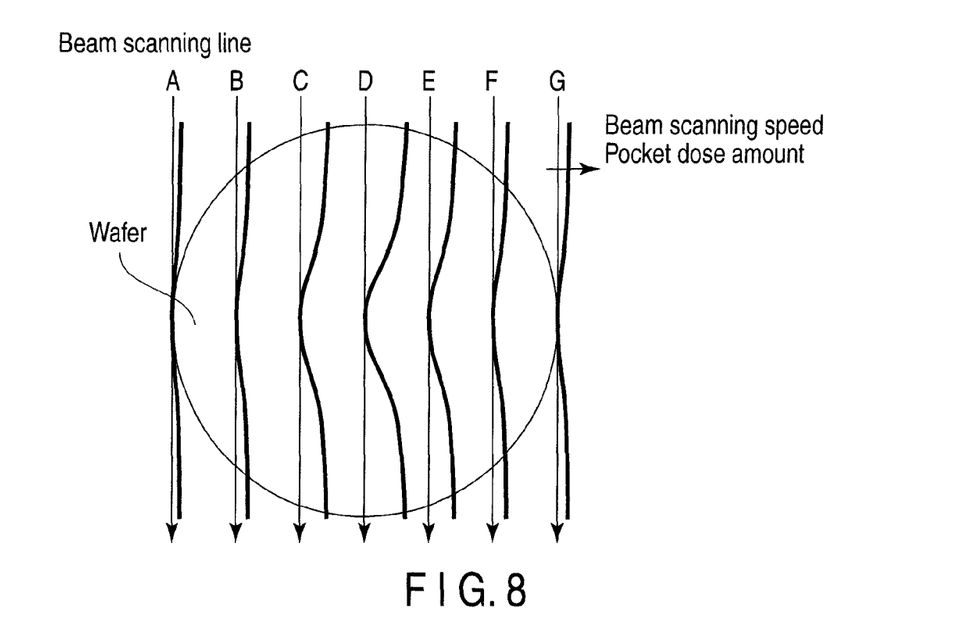
FIG. 8 is a view showing an example of beam scanning upon pocket ion implantation.
Figure 9:
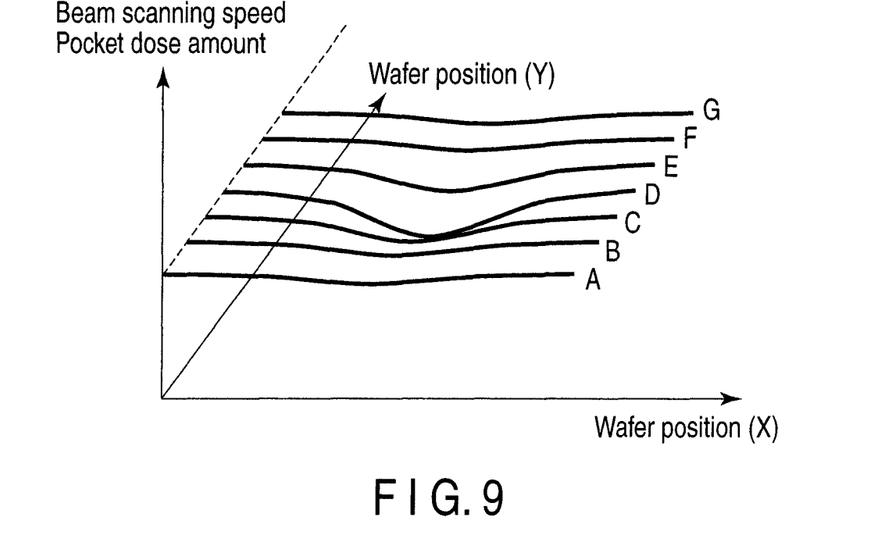
FIG. 9 is a view showing an example of beam scanning upon pocket ion implantation.

FIGS. 8 and 9 show an example of beam scanning in the pocket ion implantation. FIGS. 8 and 9 show scanning lines A to G; however, it is not limited to this, and the number of scanning lines can be arbitrarily set. The beam scanning speed is changed on a scanning line in accordance with the position of a wafer, whereby the dose amount is controlled.

FIGS. 8 and 9 show an example in which the dose amount at the wafer central part is symmetric to the dose amount at the wafer outer peripheral part. However, it is not limited to this.

Figure 10:
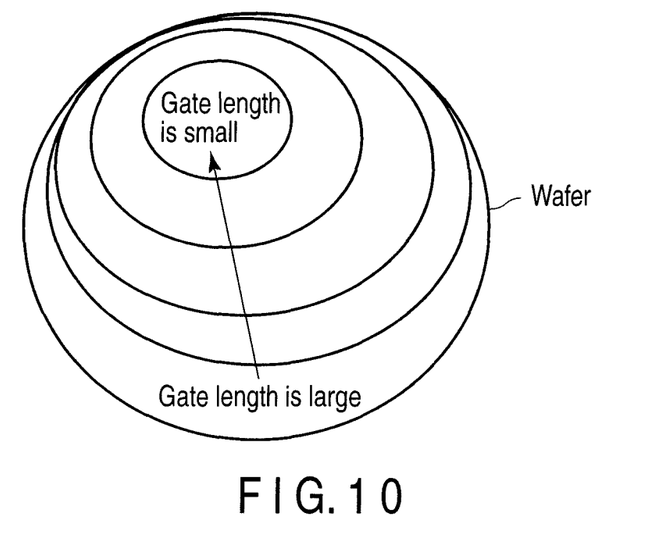
FIG. 10 is a view showing another example of the distribution of the gate length with respect to a wafer.

FIG. 10 shows a case in which a large number of small gate lengths are distributed at a position displaced from the wafer central part, and a large number of large gate lengths are distributed at the opposite side. Namely, as shown by the arrow, a large number of small gate lengths are distributed from the lower side of the illustration of the wafer toward the upper left side.

Figure 11:
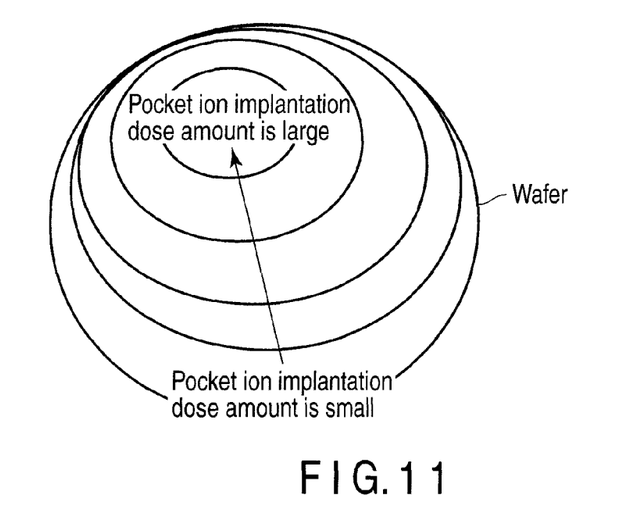
FIG. 11 is a view showing distribution of a dose amount for correcting a threshold voltage of the distribution of the gate length shown in FIG. 10.

When the gate length data in a wafer surface shown in FIG. 10 has been obtained, the pocket ion implantation dose amount may be set as shown in FIG. 11. Namely, as shown by the arrow, the dose amount may be gradually increased from the lower side of the illustration of the wafer toward the upper left side. Thus, the dose amount in the pocket ion implantation is set so that the dose amount in the region with the small gate length is larger than that in the region with the large gate length in the wafer surface. The change in the dose amount by the beam scanning by the ion implantation device 15 can be controlled at an arbitrary position in the wafer surface.

The accuracy of the above formula is required to be verified by an actual device. Thus, in order to achieve the matching with the actual device, the operations in the above steps S1 to S8 should be performed in other rot in advance.

Thereafter, the following manufacturing process is applied to the wafer in which the pocket ion implantation has been performed (S9).

According to the first embodiment, in the production line, the gate electrode is formed on the wafer to measure the gate length of the gate electrode formed on the wafer, and, thus, to obtain the distribution of the gate length in the wafer surface, whereby the dose amount in the pocket ion implantation is calculated based on the measured gate length data to implant ions into the wafer surface in accordance with the calculated dose amount. Therefore, in the manufacturing process of the gate electrode, even when the variation in the gate length occurs in the wafer surface, the dose amount in the pocket ion implantation is controlled, whereby the threshold voltage in the wafer surface can be made uniform. Thus, the variation in the final threshold voltage can be controlled, whereby the yield of products can be improved.

Further, the measurement of the gate length and the calculation of the dose amount can be performed in parallel during the feeding of the wafer from the manufacturing process of the gate electrode to the ion implantation process, and the calculation result of the dose amount is supplied to the ion implantation device 15, whereby the pocket ion implantation can be applied to the wafer fed to the ion implantation device 15. Namely, the calculation result of the dose amount obtained from the measurement result of the gate length is fed forward to the pocket ion implantation process, whereby the threshold voltage in the wafer surface can be made uniform. Therefore, the increasing of the manufacturing time can be prevented to improve the yield of products.

(Second Embodiment)

In the first embodiment, the gate length in the wafer surface is measured to control the dose amount in the pocket ion implantation in accordance with the variation in the measured gate length in the wafer surface. Meanwhile, in the second embodiment, the gate width in the wafer surface is measured to control the dose amount in the pocket ion implantation on the basis of the average value of the measured gate width. The constitution of a manufacturing system for a semiconductor device in the second embodiment is similar to the first embodiment.

Figure 12:
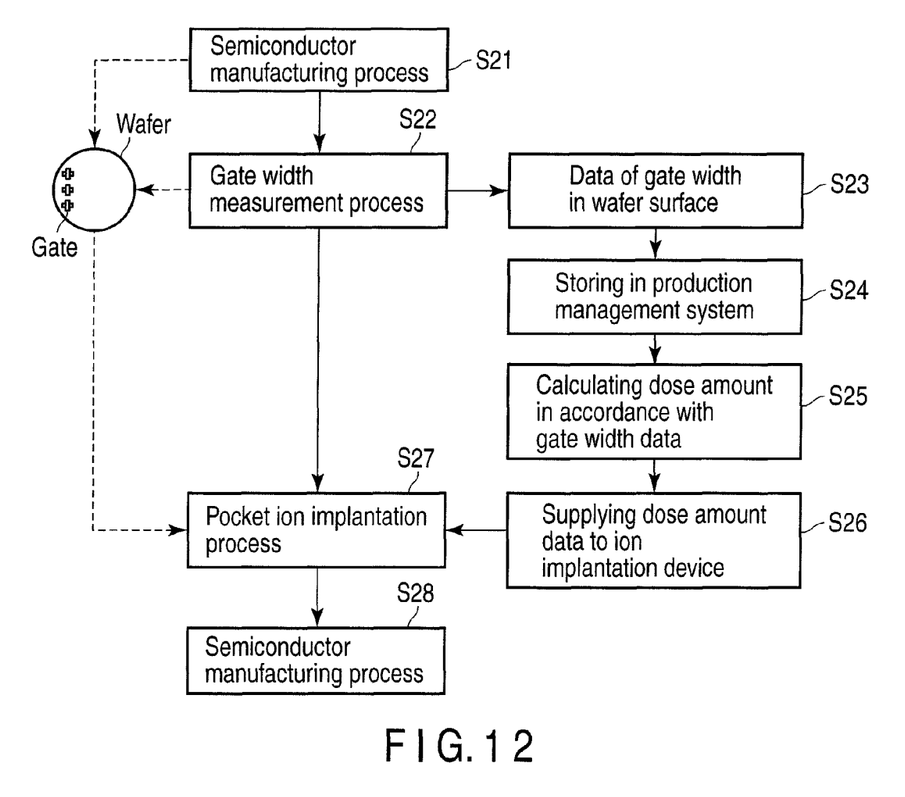
FIG. 12 is a flowchart showing the operation of a second embodiment.

FIG. 12 shows the operation of the second embodiment. The operation of the second embodiment is described with reference to FIG. 12.

For example, a gate electrode of a transistor as a semiconductor device is manufactured on a wafer by means of the first device group 10 shown in FIG. 2 (S21). Next, the gate width of the transistor is measured by the inspection device 21 and the measuring device 22 constituting the second device group 20 (S22 and S23). Namely, the gate width is measured by means of a dimension SEM, a scatterometry device, and the like. The measurement data is stored in the production management system 32 through the input-output equipment and system 31 of the production management calculator 30 (S24).

In the measurement of the gate width, although all chips in a wafer may be measured, only the gate widths at some representative positions may be measured. When only the gate widths at some positions are measured, the gate width data at unmeasured positions may be interpolated by the fitting function representing the positional dependence in the wafer surface.

Thereafter, the dose amount in the pocket ion implantation process after the measurement of the gate width in the wafer surface is calculated by the data calculation system 34 (S25) for example. The calculation result is stored in the production management system 32.

Figure 13:
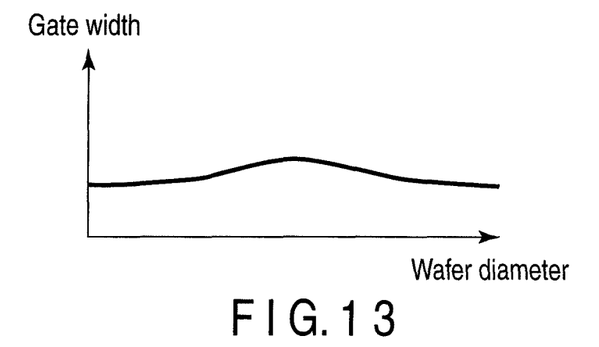
FIG. 13 is a view showing an example of distribution of a gate width in a wafer surface.
Figure 14:
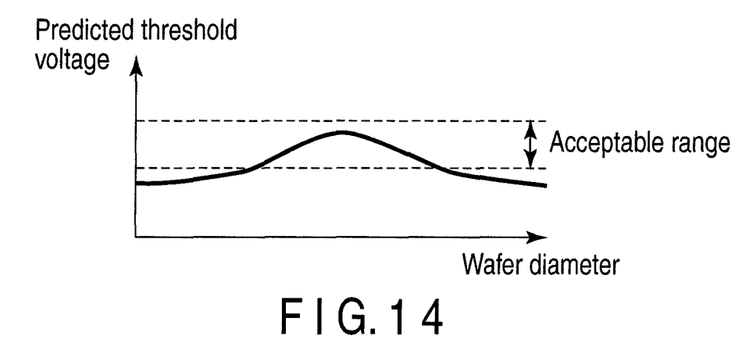
FIG. 14 is a view showing distribution of an expected threshold voltage corresponding to the distribution of the gate length shown in FIG. 13.
Figure 15:
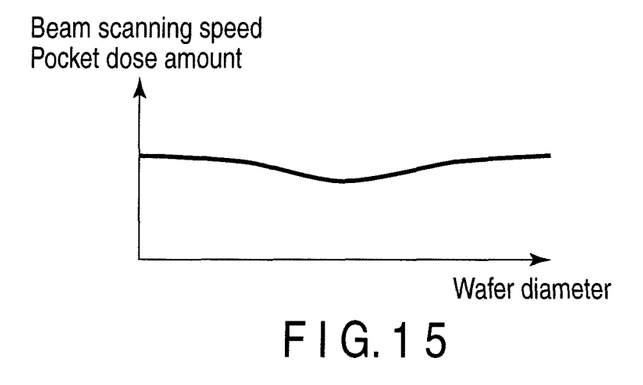
FIG. 15 is a view showing distribution of a dose amount for correcting the distribution of the threshold voltage shown in FIG. 13.
Figure 16:
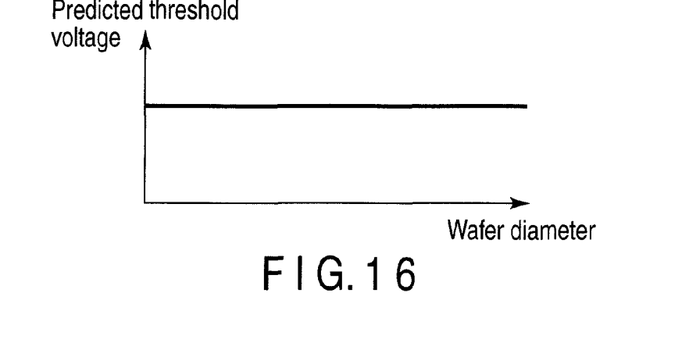
FIG. 16 is a view showing the threshold voltage distribution after correction.

FIG. 13 shows the distribution of the gate width in the wafer surface measured in step S22. FIG. 14 shows the distribution of the threshold voltage in the wafer surface predicted corresponding to the distribution of the gate width shown in FIG. 13. The relation between the gate width and the threshold voltage is similar to the relation between the gate length and the threshold voltage. Therefore, the dose amount in the pocket ion implantation for interpolating the distribution of the threshold voltage shown in FIG. 14 is calculated. Namely, when the gate width at the wafer outer peripheral part is smaller then the gate width at the wafer central part, as shown in FIG. 13, the dose amount at the wafer outer peripheral part is rendered larger than the dose mount at the wafer central part, as shown in FIG. 15, whereby, as shown in FIG. 16, the threshold voltage in the wafer surface can be made uniform.

Next, the calculated dose amount data is supplied to the ion implantation device 15 (S26). The ion implantation device 15 controls the ion implantation into the wafer in accordance with the supplied dose amount data (S27). The ion implantation device 15 scans the wafer surface with an ion implantation beam, and, thus, to implant ions into the wafer. Namely, the ion implantation device 15 controls the scanning speed of the beam, that is, the dose amount in accordance with the distribution data of the dose amount in the wafer surface to perform the pocket ion implantation corresponding to each gate.

Figure 17:
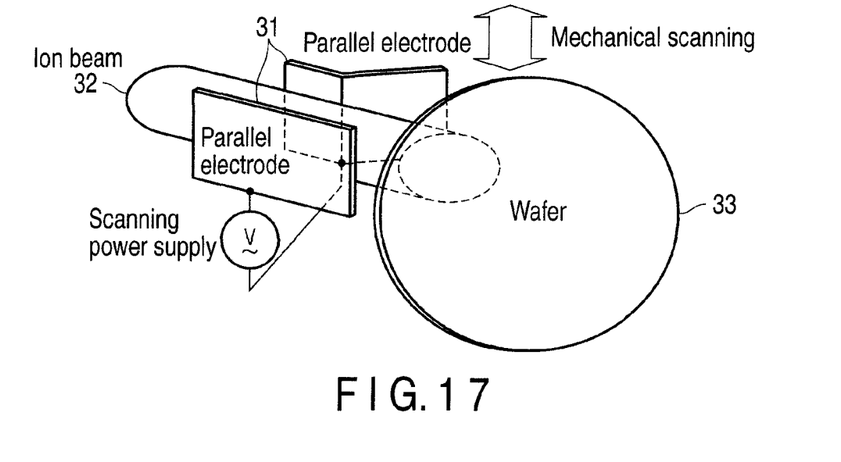
FIG. 17 is a schematic view showing a first example of an ion implantation device.

FIG. 17 shows a first example of the ion implantation device 15. This ion implantation device 15 controls the voltage applied to parallel electrodes 31, whereby performs scanning with an ion beam 32 horizontally in an electric field formed horizontally to mechanically move a wafer 33 vertically. This ion implantation device 15 controls the voltage applied to the parallel electrodes 31 in accordance with the supplied dose amount data, whereby the dose amount of ions to be implanted in the wafer surface is controlled.

Figure 18:
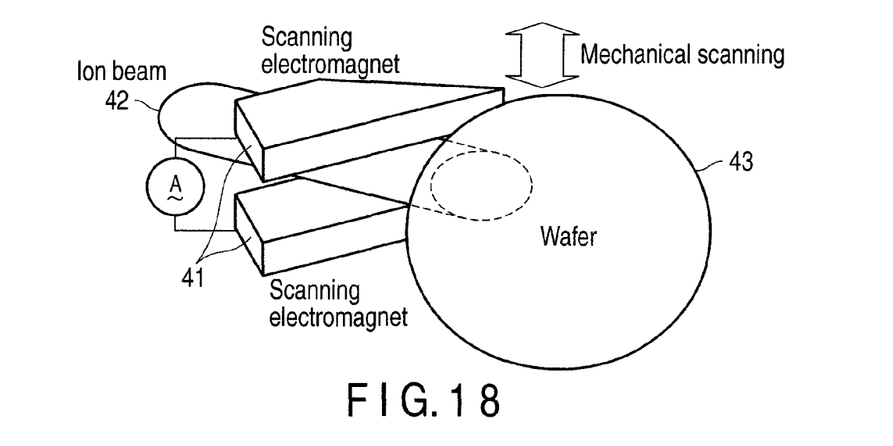
FIG. 18 is a schematic view showing a second example of the ion implantation device.

FIG. 18 shows another example of the ion implantation device 15. This ion implantation device 15 performs scanning with an ion beam 42 horizontally in an magnetic field, generated by controlling a current supplied to scanning electromagnets 41 disposed vertically, to mechanically move a wafer 43 vertically. This ion implantation device 15 controls the current supplied to the scanning electromagnets 41 in accordance with the supplied dose amount data, whereby the dose amount of ions implanted in the wafer surface is controlled.

Figure 19:
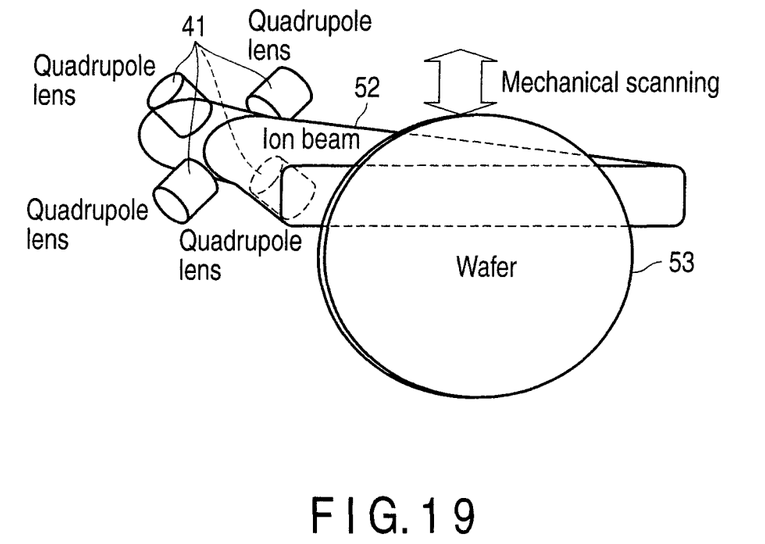
FIG. 19 is a schematic view showing a third example of the ion implantation device.

In the ion implantation device 15 shown in FIG. 19, an ion beam 52 is enlarged in size horizontally by means of quadrupole lenses 51 to mechanically move a wafer 53 vertically. This ion implantation device 15 controls a current supplied to the quadrupole lenses 51 in accordance with the supplied dose amount data, whereby the dose amount of ions to be implanted in the wafer surface is controlled.

According to the second embodiment, in the production line, the gate electrode is formed on the wafer to measure the gate width of the gate electrode formed on the wafer, and, thus, to obtain the distribution of the gate width in the wafer surface, whereby the dose amount in the pocket ion implantation is calculated based on the measured gate width data to implant ions into the wafer surface in accordance with the calculated dose amount. Therefore, in the manufacturing process of the gate electrode, even when the variation in the gate width occurs in the wafer surface, the dose amount in the pocket ion implantation is controlled, whereby the threshold voltage in the wafer surface can be made uniform. Thus, the rate of chips as conforming products obtained from a wafer can be increased, whereby the yield of products can be improved.

Further, the measurement of the gate width and the calculation of the dose amount can be performed in parallel during the feeding of the wafer from the manufacturing process of the gate electrode to the ion implantation process, and the calculation result of the dose amount is supplied to the ion implantation device 15, whereby the pocket ion implantation is applied to the wafer fed to the ion implantation device 15. Namely, the calculation result of the dose amount obtained from the measurement result of the gate width is fed forward to the pocket ion implantation process, whereby the threshold voltage in the wafer surface can be made uniform. Therefore, the increasing of the manufacturing time can be prevented to improve the yield of products.

In the second embodiment, the dose amount data in the ion implantation is calculated from the measurement result of the gate width in order to interpolate the threshold voltage in the wafer surface. However, it is not limited to this, and it is possible to calculate the average value of the gate width to calculate for example a constant dose amount in accordance with the average value, and, thus, to control the ion implantation on the basis of the calculated dose amount. Such a constitution can have an effect similar to the second embodiment.

In addition, the ion implantation devices shown in FIGS. 17 to 19 can be applied to the first embodiment.

Further, the control of the threshold voltage of the transistor has been described in the first and second embodiments; however, it is not limited to this, and the first and second embodiments can be applied to the uniformity in a wafer surface of an electrical property such as resistance of a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
    forming a plurality of gate electrodes with different widths and different lengths on a wafer;
    measuring one of a gate width and a gate length of the plurality of gate electrodes formed on the wafer to obtain a distribution of one of the gate width and the gate length having one of a small gate width and a small gate length and having one of a large gate width and a large gate length;
    calculating data of an ion implantation dosage for making uniform a threshold voltage in a wafer surface on the basis of distribution of one of the measured gate width and the measured gate length in a wafer surface, wherein the data of the ion implantation dosage corresponding to a region of a distribution with the small gate width or the small gate length is larger than a region of a distribution with the large gate width or the large gate length; and
    implanting ions into the wafer on the basis of the calculated data of the ion implantation dosage,
    wherein the ion implantation dosage is controlled by changing a scanning speed in accordance with a position of the wafer during a scanning along a scanning line, and
    wherein the scanning speed corresponding to a region of a distribution with the small gate width or the small gate length is slower than a region of a distribution with the large gate width or the large gate length.

2. The method according to claim 1, wherein the measurement of one of the gate width and the gate length and the calculation of the data are performed while the wafer is fed from a manufacturing process of the gate electrode to an ion implantation process.

3. The method according to claim 2, wherein the measurement of one of the gate width and the gate length is performed at some positions in the wafer surface.

4. The method according to claim 3, wherein on the basis of measurement data of one of the gate width and the gate length measured at some positions, data of one of the gate width and the gate length at positions other than the measured positions is predicted.

5. The method according to claim 4, wherein the data of the ion implantation dosage is calculated based on the measured data and the predicted data.

* * * * *